US006593785B1

(12) United States Patent
Field et al.

(10) Patent No.: US 6,593,785 B1
(45) Date of Patent: *Jul. 15, 2003

(54) METHOD AND CIRCUIT FOR REDUCING POWER AND/OR CURRENT CONSUMPTION

(75) Inventors: Dean L. Field, Graham, WA (US); Larry Lynn Hinton, Bothell, WA (US); John Kizziar, III, Cheyenne, WY (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/133,851

(22) Filed: Apr. 26, 2002

Related U.S. Application Data

(60) Continuation of application No. 09/391,135, filed on Sep. 7, 1999, now abandoned, which is a division of application No. 08/767,767, filed on Dec. 17, 1996, now Pat. No. 5,949,261.

(51) Int. Cl.[7] ................................................ H03L 7/06
(52) U.S. Cl. ......................... 327/156; 327/157; 327/42; 327/142
(58) Field of Search ............................. 327/40, 41, 42, 327/47, 147, 148, 156, 157, 165, 544, 142, 143; 331/17, 25, DIG. 2

(56) References Cited

U.S. PATENT DOCUMENTS

| | | | |
|---|---|---|---|
| 3,720,841 A | 3/1973 | Suzuki | 307/221 C |
| 3,749,936 A | 7/1973 | Bell | 307/202 |
| 3,906,258 A | 9/1975 | Moe | 307/232 |
| 3,922,526 A | 11/1975 | Cochran | 235/152 |
| 3,971,920 A | 7/1976 | Johnson | 235/92 SH |
| 4,034,301 A | 7/1977 | Kashio | 328/37 |
| 4,144,448 A | 3/1979 | Pisciotta et al. | 235/301 |
| 4,293,927 A | 10/1981 | Hoshii | 364/900 |
| 4,341,950 A | 7/1982 | Kyles et al. | 235/92 EA |
| 4,404,972 A | 9/1983 | Gordon et al. | 128/419 PG |

(List continued on next page.)

FOREIGN PATENT DOCUMENTS

| | | |
|---|---|---|
| JP | 04-158631 | 1/1992 |
| JP | 6-187063 | 7/1994 |

OTHER PUBLICATIONS

"High–Speed–CPU Design: 40–MHz CMOS circuits send designers back to school", By John Gallant, EDN–Technology Update, Mar. 2, 1992, pp. 67–76.

"8051 tackles secure smart–card applications", By Ray Weiss, EDN–Processor Update, Dec. 10, 1992, pp. 46 and 48.

CS8140, CS8141, "5.0 V, 500 mA Linear Regulator with Enable, Reset, and Watchdog", Semiconductor Components Industries, LLC, Apr. 2001—Rev. 11, pp. 1–20.

(List continued on next page.)

Primary Examiner—Terry D. Cunningham
Assistant Examiner—Quan Tra
(74) Attorney, Agent, or Firm—Christopher P. Maiorana, P.C.

(57) ABSTRACT

An apparatus comprising a first circuit and a second circuit. The first circuit may be configured to receive a device input signal. The apparatus may be configured to perform a predefined function in response to the device input signal during normal operation. The second circuit may be configured to determine when the device input signal is invalid according to a predetermined parameter. The second circuit may be configured to generate a function control signal in response to the predetermined parameter. The function control signal may be configured to direct the apparatus to perform a second predetermined function. The second predetermined function may be different than the first predetermined function.

20 Claims, 4 Drawing Sheets

U.S. PATENT DOCUMENTS

| | | | |
|---|---|---|---|
| 4,467,285 A | 8/1984 | Rinaldi | 328/112 |
| 4,472,821 A | 9/1984 | Mazin et al. | 377/79 |
| 4,598,214 A | 7/1986 | Sexton | 307/291 |
| 4,615,005 A | 9/1986 | Maejima et al. | 364/200 |
| 4,633,097 A | 12/1986 | Dewitt | 307/269 |
| 4,686,386 A | 8/1987 | Tadao | 307/269 |
| 4,747,057 A | 5/1988 | DiGiulio et al. | 364/464 |
| 4,787,097 A | 11/1988 | Rizzo | 375/120 |
| 4,794,628 A | 12/1988 | Sakamoto et al. | 377/28 |
| 4,851,987 A | 7/1989 | Day | 364/200 |
| 4,920,282 A | 4/1990 | Muraoka et al. | 307/442 |
| 4,962,487 A | 10/1990 | Suzuki | 365/233.5 |
| 5,065,047 A | 11/1991 | Igari et al. | 307/442 |
| 5,079,666 A | 1/1992 | Najm | 361/85 |
| 5,120,988 A | 6/1992 | Matsuki | 307/269 |
| 5,136,180 A | 8/1992 | Caviasca et al. | 307/269 |
| 5,175,845 A | 12/1992 | Little | 395/550 |
| 5,202,906 A | 4/1993 | Saito et al. | 331/14 |
| 5,203,003 A | 4/1993 | Donner | 395/800 |
| 5,260,979 A | 11/1993 | Parker et al. | 375/108 |
| 5,294,894 A | 3/1994 | Gebara | 331/1 A |
| 5,343,096 A | 8/1994 | Heikes et al. | 307/480 |
| 5,369,311 A | 11/1994 | Wang et al. | 327/292 |
| 5,388,265 A | 2/1995 | Volk | 395/750 |
| 5,401,988 A | 3/1995 | Kudou et al. | 257/207 |
| 5,410,572 A | 4/1995 | Yoshida | 375/376 |
| 5,434,819 A | 7/1995 | Matsuo et al. | 365/189.07 |
| 5,489,902 A | 2/1996 | Shyu et al. | 341/136 |
| 5,502,689 A | 3/1996 | Peterson et al. | 368/156 |
| 5,530,879 A | 6/1996 | Crump et al. | 395/750 |
| 5,541,943 A | 7/1996 | Niescier et al. | 371/62 |
| 5,552,727 A | 9/1996 | Nakao | 327/159 |
| 5,555,032 A | 9/1996 | Kung | 348/730 |
| 5,572,167 A | 11/1996 | Alder et al. | 331/2 |
| 5,577,086 A | 11/1996 | Fujimoto et al. | 375/376 |
| 5,634,131 A | 5/1997 | Matter et al. | 395/750 |
| 5,646,572 A | 7/1997 | Masleid | 327/545 |
| 5,649,098 A | 7/1997 | Shieh et al. | 395/185.08 |
| 5,680,286 A | 10/1997 | Pacholok | 361/42 |
| 5,699,020 A | 12/1997 | Jefferson | 331/17 |
| 5,818,365 A | * 10/1998 | Hush et al. | 341/100 |
| 5,828,253 A | 10/1998 | Murayama | 327/156 |
| 5,842,029 A | 11/1998 | Conary et al. | 395/750.04 |
| 5,884,088 A | 3/1999 | Kardach et al. | 395/750.06 |
| 5,903,767 A | 5/1999 | Little | 395/750.05 |
| 5,918,043 A | 6/1999 | Kardach et al. | 395/560 |
| 5,935,253 A | 8/1999 | Conary et al. | 713/322 |
| 5,978,425 A | 11/1999 | Takia | 375/374 |
| 6,079,025 A | 6/2000 | Fung | 713/323 |
| 6,193,422 B1 | 2/2001 | Belt et al. | 395/750 |

OTHER PUBLICATIONS

"Delivering The High–Speed Clock—It's Not Easy To Be On Time", By Bill Schweber, EDN–Cover Story, Jul. 6, 1995, pp. 32–44.

"Fax Modem Chip Handles Text, Photos, and Voice: Modem Chip Teams With Controller IC To Form Multimedia Link Between PCs and Portables Over Phone Lines", By Milt Leonard, Product Innovation, Electronic Design, Sep. 26, 1991, pp. 161–164.

"High–speed clock drivers catch up with $\mu$Ps", By John Gallant, EDN–Technology Update, Jun. 24, 1993, pp. 87–96.

EDN–New Products, Integrated Circuits.

"5V Regulator for $\mu$P Functions", EDN–New Products, Integrated Circuits, Mar. 30, 1992, pp. 153.

"Speedy Bus Logic Trims I/O Propagation Delay", By Dave Bursky, New Products–Digital ICs, Electronic Design, Dec. 13, 1990, pp. 132.

"High–Speed Digital Circuits: Timing techniques help signals stay in sync", By Anne Watson Swager, EDN–Technology Update, Feb. 17, 1992, pp. 81–90.

"A Wide–Bandwidth Low–Voltage PLL for PowerPC™ Microprocessors", By Jose Alvarez et al., IEEE Journal of Solid–State Circuits, vol. 30, No. 4, Apr. 1995, pp. 383–391.

ViRGE/VX Integrated 3D Accelerator, S3 Incorporated, Jun. 1996, pp. 3–1to 3–15, 9–1to 9–3, 12–3 and 17–4.

ViRGE/VX Integrated 3D Accelerator, S3 Incorporated, Feb. 1996, pp. 3–1 to 3–19, 9–1 to 9–3 and 12–4.

ViRGE/DX & GX 3D Accelerators, S3 Incorporated, Aug. 1996, pp. 1–1 to 1–2, 2–4 to 2–8, 4–1 to 4–10.

ViRGE/GX2 Integrated 3D Accelerator, S3 Incorporated, Dec. 1996, pp. 3–3 to 3–8, 5–1 to 5–11, 8–1 to 8–4 and 17–5.

"AN 80–nb 1–Mb Flash Memory with On–Chip Erase/Erase–Verify Controller", Seki et al., IEEE Journal of Solid–State Circuits, vol. 25, No. 5, Oct. 1990, pp 1147–1151.

Cypress Data Book CD–ROM Summer 1996 CY27H512, Cypress Semiconductor Corporation, Jun. 1994, Revised Oct. 1995, pp 1–11.

ICD2093, Cypress Semiconductor Corporation, Mar. 1995, pp. 1–2.

Cypress Data Book CD–ROM Summer 1996, CY2291/CY2292, Cypress Semiconductor Corporation,, Jun. 1994, Revised Sep. 1995, pp. 1–7.

Cypress Data Book CD–ROM Summer 1996, CY7C42X/46X FIFO Interface to the CY7B923, (Hotlink.TM.), Cypress Semiconductor Corporation, pp 6–326 to 6–328.

Cypress Data Book CD–ROM Summer 1996, CY7B9910/CY7B9920, Cypress Semiconductor Corporation, Nov. 1994, Revised Feb. 1996, pp. 1–7.

Cypress Data Book CD–ROM Summer 1996, CY7B991/CY7B992 (Roboclock) Test Mode, Cypress Semiconductor Corporation, pp. 1–13.

Cypress Data Book CD–ROM Summer 1996, CY7B923/CY7B933, Cypress Semiconductor Corporation, Dec. 1991, Revised Aug. 1994, pp. 1–28.

* cited by examiner

METHOD AND CIRCUIT FOR REDUCING POWER AND/OR CURRENT CONSUMPTION

This is a continuation application of U.S. Ser. No. 09/391,135, filed Sep. 7, 1999 now abandoned, which is a divisional application of U.S. Ser. No. 08/767,767, filed Dec. 17, 1996, now U.S. Pat. No. 5,949,261.

BACKGROUND OF THE INVENTION

1. Field of the Invention

The present invention relates to semiconductor devices, and, more particularly, to a method and circuit for automatically reducing power consumption in a semiconductor device without the use of external logic or a dedicated pin.

2. Discussion of Related Art

Electrical products of today quite often incorporate semiconductor devices due to their many advantages. The use of such devices has enabled electrical products to accomplish tasks more quickly and efficiently than was previously possible. In an effort to continually improve such products, a desired goal has been to reduce the amount of power consumed during the operation of the products. Towards this end, it is desirable to reduce the power consumption of a product's component parts, including any semiconductor devices. One way to accomplish this goal is to "power down" the semiconductor device when the device is in a predefined state, such as an inactive state, so that the semiconductor device draws a reduced amount of current, and therefore, consumes less power.

One approach taken in the art to power down a semiconductor device is to pass a signal to the device over a dedicated pin or combination of dedicated pins, which signal directs the device to power down. A second approach taken in the art is to use a dedicated serial port or other communication scheme to direct a power down command word to the semiconductor device. The power down command word is then decoded, wherein the device is powered down. A significant problem with both of these approaches is that they require the use of at least one dedicated pin of the semiconductor device to accomplish the power down function. Oftentimes, a dedicated pin is unavailable because all of the pins on the semiconductor device are used to perform other functions. Thus, a "power down" mode cannot be implemented on such devices using prior technology. In addition, there are often situations where all existing input states of a semiconductor device are reserved for other functions. The effect of this situation is the same—no power down mode can be implemented on such devices using prior technology.

Accordingly, there is a need to provide a system for powering down a semiconductor device that minimizes or eliminates one or more of the problems set forth above.

SUMMARY OF THE INVENTION

The present invention provides a method and an apparatus for controlling a semiconductor device without the use of a dedicated pin. An advantage of such a system is that one may reduce current or power consumption in a semiconductor device that does not have a spare, dedicated pin, as may be required by conventional approaches. A method in accordance with this invention includes two main steps. The first step involves determining whether a detector input signal, corresponding to or derived from a device input signal, is invalid according to a predetermined parameter. The device is configured to perform a first predefined function, responsive to the device input signal, during normal operation. The second step involves generating, in response to the above determination, a function control signal configured to direct the semiconductor device to perform a second predefined function. The second predefined function is different from the first function. That is, an existing input signal used for one purpose in effect, is used for a second purpose. No dedicated signals, or terminals are required. The detector input signal may be derived directly from the device input signal, or it may be derived indirectly therefrom (e.g., by passing the device input signal through a buffer, PLL, or other structure).

In a preferred embodiment, the above-mentioned predetermined parameter is a minimum frequency associated with the detector input signal, and the second predefined function comprises reducing the power or current consumed by the semiconductor device (e.g., entering a "power down" mode). The function control signal thus may comprise a power down signal in a preferred embodiment. In operation, when the frequency of the detector input signal is less than the minimum frequency, the power down signal is generated which directs the semiconductor device to "power down," or reduce current consumption in, at least one of its component circuits. By determining when the semiconductor device should be powered down based on a preexisting input signal to the device, rather than by using a dedicated pin to receive a dedicated "power down" input signal, a pin on the device may be preserved for other functions. Alternatively, the power down function may be implemented on a device which was previously incapable of such a function (due to pin limitations).

In another aspect of the present invention, an apparatus is provided which includes means for receiving a device input signal that performs a first predefined function during normal operation of the semiconductor device, and means for determining whether a detector input signal corresponding to the device input signal is invalid according to a predetermined parameter and generating in response thereto a function control signal to direct the semiconductor device to perform a second predefined function, wherein the second predefined function is different from the first predefined function. In a preferred, zero-delay buffer embodiment, the predetermined parameter is a minimum frequency associated with the detector input signal, and the second predefined function comprises reducing the power or current consumed by the zero-delay buffer (e.g., entering a "power down" mode). The function control signal may thus comprise a power down signal.

In a zero-delay buffer embodiment, the receiving means includes a pin on the buffer that is used for receiving an input signal as the device input signal. The device input signal is a signal already being used by the buffer to perform the first predefined function. For example, the device input signal may be an input clock signal. This input clock signal is used during normal operation, and is not dedicated exclusively for use in powering down the device. Also, the input clock signal is characterized by a minimum operating frequency, below which frequency the input clock signal may be considered to be invalid. The detector input signal is preferably directly derived from the device input (clock) signal, although, in alternative embodiments, the detector input signal is indirectly derived from the device input signal. The determining means includes a frequency detector in a preferred embodiment. The frequency detector determines whether the frequency of the detector input signal is less than the minimum frequency. If so, the frequency detector may generate the power down signal. In effect, the frequency detector may define a signal validity detector in a broader aspect of the present invention. For example, in other embodiments of the present invention, the means or circuit for determining signal invalidity of the detector input signal may alternately make such a determination based on such parameters as jitter, or phase lock (for PLL-based embodiments), or the like. An apparatus according to the present invention thus enables a semiconductor device to be powered down without the need for a dedicated pin.

These and other features and objects of this invention will become apparent to one skilled in the art from the following detailed description and the accompanying drawings illustrating features of this invention by way of example.

DETAILED DESCRIPTION OF THE PREFERRED EMBODIMENTS

Figure 1:
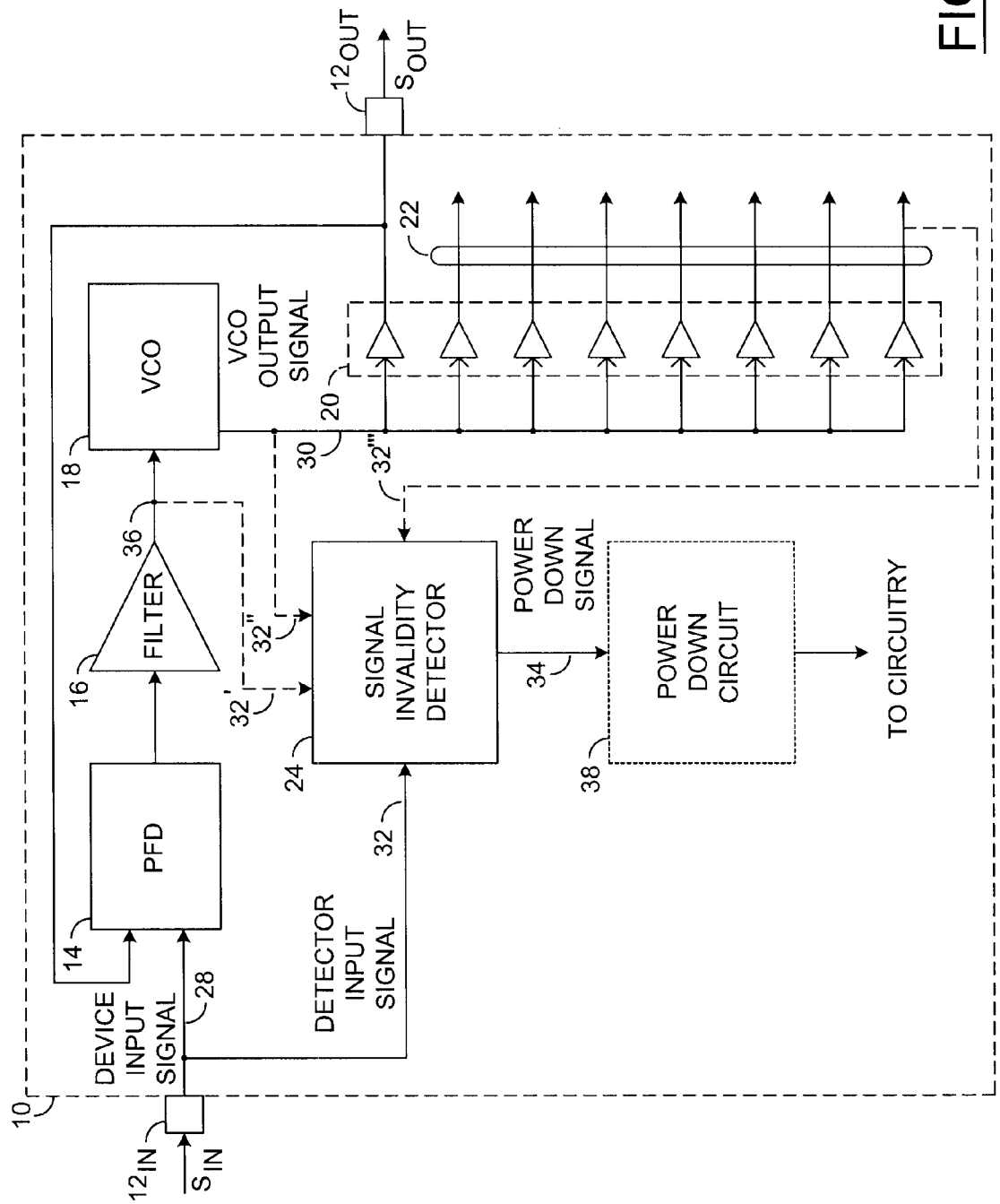
FIG. 1 is a simplified block diagram view of one embodiment of a semiconductor device—a zero-delay buffer—according to the present invention.

Referring now to the drawings wherein like reference numerals are used to identify identical components in the various views, FIG. 1 shows a first, preferred embodiment of a semiconductor device according to the present invention, in particular a zero-delay buffer 10. Buffer 10 is generally capable of receiving an input signal $S_{IN}$, and generating one or more output signals $S_{OUT}$ in response thereto that are substantially synchronized with the input signal $S_{IN}$ (i.e., no or "zero delay"). Buffer 10 includes a terminal or pin $12_{IN}$ for receiving the input signal $S_{IN}$ and a terminal or pin $12_{OUT}$ for outputting the output signal $S_{OUT}$, from and to, external circuitry or devices, respectively.

Before proceeding to a detailed description of zero-delay buffer 10, as well as other embodiments according to the present invention, a brief description of the broad device control established by the present invention will be set forth. A basic problem in the art, as set forth in the Background, involves an inability to implement a reduced power mode of operation in a pin limited semiconductor device package. This problem stems from the need for a dedicated pin in order to implement the reduced power mode when following the teachings of conventional approaches.

The present invention overcomes these limitations by providing a means or structure that monitors an input signal to the device. This input signal is provided to the device for an operational first function other than reducing power or current (e.g., input clock). Thus, no dedicated "power down" pins are required. Further, the input signal monitoring structure is configured to determine when the input signal is in an "invalid" state according to one or more predetermined parameters. When this state is detected, an embodiment of the present invention automatically performs a second predefined function (e.g., enters a reduced power/current-consuming, or "power down," state). The first and second functions are different. In view of the foregoing, a semiconductor device is provided that overcomes the above-mentioned limitations of conventional pin-limited packages.

The scope and underlying principles of the present invention are much broader than the specific and preferred embodiments described in detail hereinafter. For example, the predefined function may be a power down mode, the predetermined parameter may be a minimum frequency of the detector input signal, and the monitoring structure or means may comprise a signal invalidity detector (specifically a frequency detector). Alternative embodiments are contemplated, however, wherein the predetermined parameter upon which invalidity may be based may include a lock state of a PLL, a jitter parameter (e.g., expressed in percentage of nominal period of a signal), and/or a voltage parameter of a PLL (e.g., the control voltage input to a voltage controlled oscillator portion of the PLL). Further, the predetermined function may alternatively comprise a suspend mode of operation (wherein preprogrammed subparts of the semiconductor device are powered down), or other reduced power mode(s) of operation. Thus, the scope of the present invention may be limited only by the appended claims, rather than the detailed description of the preferred embodiments.

Referring to FIG. 1, buffer 10 may include a phase frequency detector (PFD) 14, a filter 16, a voltage controlled oscillator (VCO) 18, a plurality of output buffers 20 for outputting a corresponding plurality of output signals 22, and a signal invalidity detector 24, such as a frequency detector 26, for first determining when a detector input signal 32, which corresponds to or is derived from a device input signal 28, is invalid according to a predetermined parameter, and second, generating in response thereto a function control signal. The buffer 10 is configured to perform a first predefined function responsive to the device input signal. The function control signal may comprise a power down signal 34 to direct buffer 10 to perform a second function that is different from the first function. In the illustrative embodiment of buffer 10, the predetermined parameter may comprise a minimum frequency value associated with detector input signal 32, while the second function may be to reduce power or current consumption in, or "power down," one or more component circuits of or coupled to buffer 10. In one embodiment of buffer 10, the minimum frequency value may be from 0.1 to 8 MHz, preferably from 1 to 5 MHz, more preferably about 2 MHz, while the normal operating frequency range is generally from about 10 MHz to about 100 MHz.

Buffer 10 may receive the input signal $S_{IN}$ on input pin $12_{IN}$, and provide it as device input signal 28 to PFD 14 and frequency detector 26. During normal operation of buffer 10, device input signal 28 has a frequency associated therewith that is greater than the minimum frequency (e.g., 2 MHz), and preferably is within a normal operating range.

PFD 14, filter 16 and VCO 18 may operate in combination to provide a VCO output signal 30 to output buffers 20 such that the output signals 22 are substantially synchronized with device input signal 28. PFD 14 is conventional in the art and is responsive to device input signal 28 and one of output signals 22 (as a feedback signal). PFD 14 may be configured to generate a lock signal to filter 16 indicative of whether, and to what extent, output signal 22 (as fed back to PFD 14) is phase-locked (or conversely, is out-of-lock) with device input signal 28. For example, this signal may comprise the well-known UP or DOWN signal, HIGH or LOW signal, or other signal representing a digital logic state (e.g., "0" [or below a threshold voltages], or "1" [or above the threshold voltage]).

Filter 16 may be coupled to PFD 14 and may be provided for amplifying and/or shaping the transfer characteristic of the lock signal generated by PFD 14. Filter 16 generally may take the form of a low-pass filter and may, in one embodiment, output a modified control signal having a voltage corresponding to a phase error between device input signal 28 and output signal 22.

VCO 18 may be coupled to filter 16 and may be provided for generating VCO output signal 30, which corresponds to device input signal 28 in a manner described above (e.g., phase locked thereto). VCO 18 is conventional and may take any one of a plurality of forms well known in the art. The frequency of VCO output signal 30 may be proportional to the applied modified control signal. Further, signal 30, which, as noted above, may also correspond to device input signal 28, may be substantially synchronized relative to device input signal 28 (subject to a small offset introduced by output buffer 22). In the illustrated configuration, the output signal 22 may be synchronized relative to device input signal 28, at least to within a predetermined and/or acceptable phase error margin.

Frequency detector 26 may be provided for determining whether a detector input signal 32, which corresponds to device input signal 28, has a frequency less than a minimum frequency. Frequency detector 26 may subsequently generate, in response to a determination that the detector input signal 32 is less than the minimum frequency, a power down signal 34 capable of directing buffer 10 to power down one or more of its component circuits. Preferably, detector input signal 32 is derived directly from device input signal 28, as shown by the solid line connection in FIG. 1. However, in an alternate zero-delay buffer embodiment, the detector input signal may comprise a signal 32', which may be derived from device input signal 28 indirectly by passing device input signal 28 through PFD 14 and/or filter 16. The potential of detector input signal 32' may be the voltage associated with a control node 36 provided to VCO 18. The magnitude of the control voltage applied to VCO 18 may control the frequency of the generated VCO output signal 30.

In yet another embodiment, the detector input signal may comprise a signal 32", which may be the VCO output signal 30 itself. Thus, the detector input signal may be derived indirectly from device input signal 28 by passing device input signal 28 through PFD 14, filter 16, and/or VCO 18. In still yet another embodiment, the detector input signal may comprise a signal 32''' which may be one of the output signals 22. Thus, the detector input signal may be derived from device input signal 28 by tapping one of the output terminals of buffers 20. Alternatively, any one of signal 32, signal 32', signal 32", and signal 32''' may be passed through one or more buffers prior to being received at frequency detector 26. The detector input signal may therefore comprise a buffered version of the device input signal.

As noted above, frequency detector 26 may generate signal 34, which is configured to power down one or more component circuits on or off of the chip in which buffer 10 is embodied. This power down function (i.e., a method of reducing power or current consumption in a circuit) occurs either by directly inputting power down signal 34 to a component circuit, or by inputting signal 34 into a power down circuit 38 which in turn generates control signals to power down component circuits on or off the chip containing buffer 10. Signal 34 may be generated, for example, when detector input signal 32, 32', 32", or 32''', is less than a predetermined parameter value (e.g., minimum frequency), indicating that the signal is in an invalid state and activating or initiating (preferably automatically) a power down mode of operation for one or more circuits.

Figure 2:
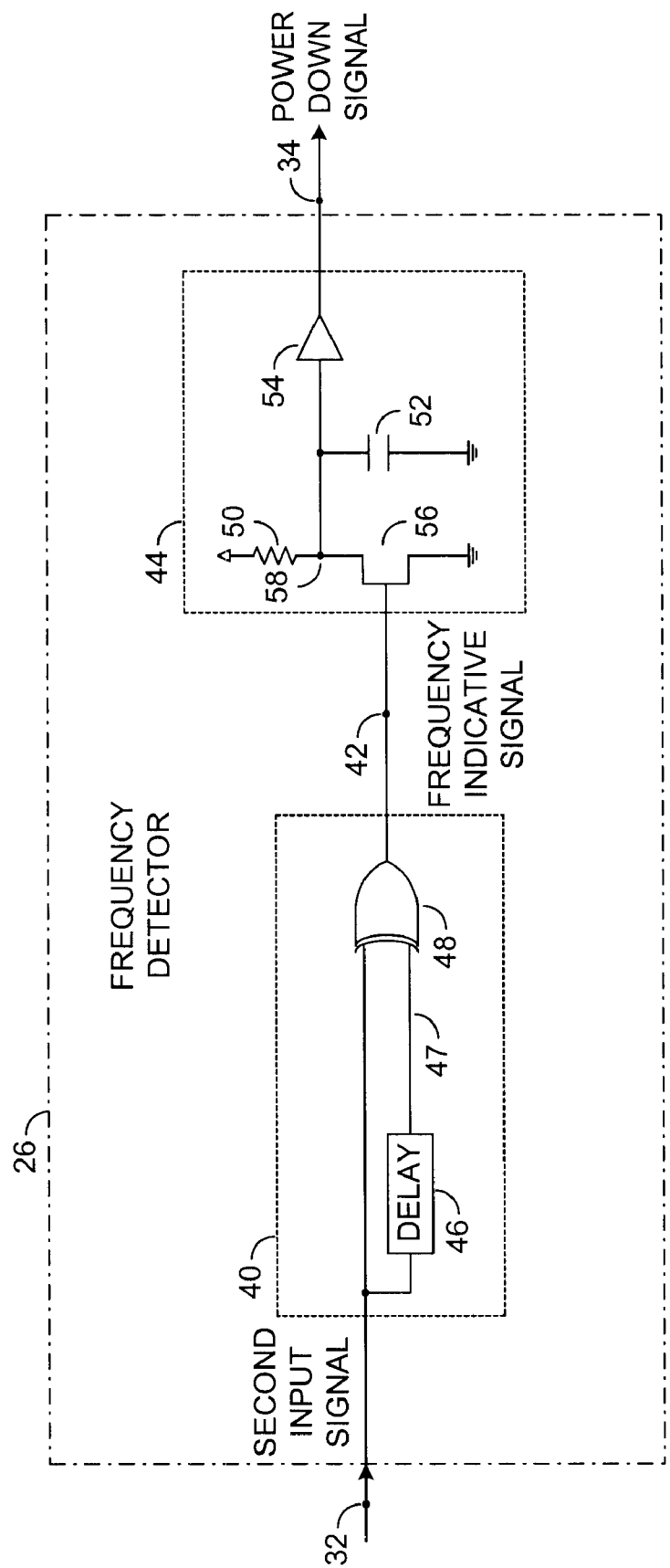
FIG. 2 is a simplified block and schematic diagram view showing, in greater detail, a frequency detector shown in block diagram form in FIG. 1.

FIG. 2 shows an exemplary frequency detector 26 in greater detail. This illustrative embodiment of detector 26 may determine whether the frequency of detector input signal 32 is less than a minimum frequency (e.g., 2 MHz). Frequency detector 26 may include means, such as a one-shot circuit 40, for producing a frequency indicator signal 42 indicative of the frequency of detector input signal 32, and means, such as power down signal output circuit 44, for outputting power down signal 34 when signal 42 indicates that the frequency of detector input signal 32 is less than the minimum frequency.

Figure 3:
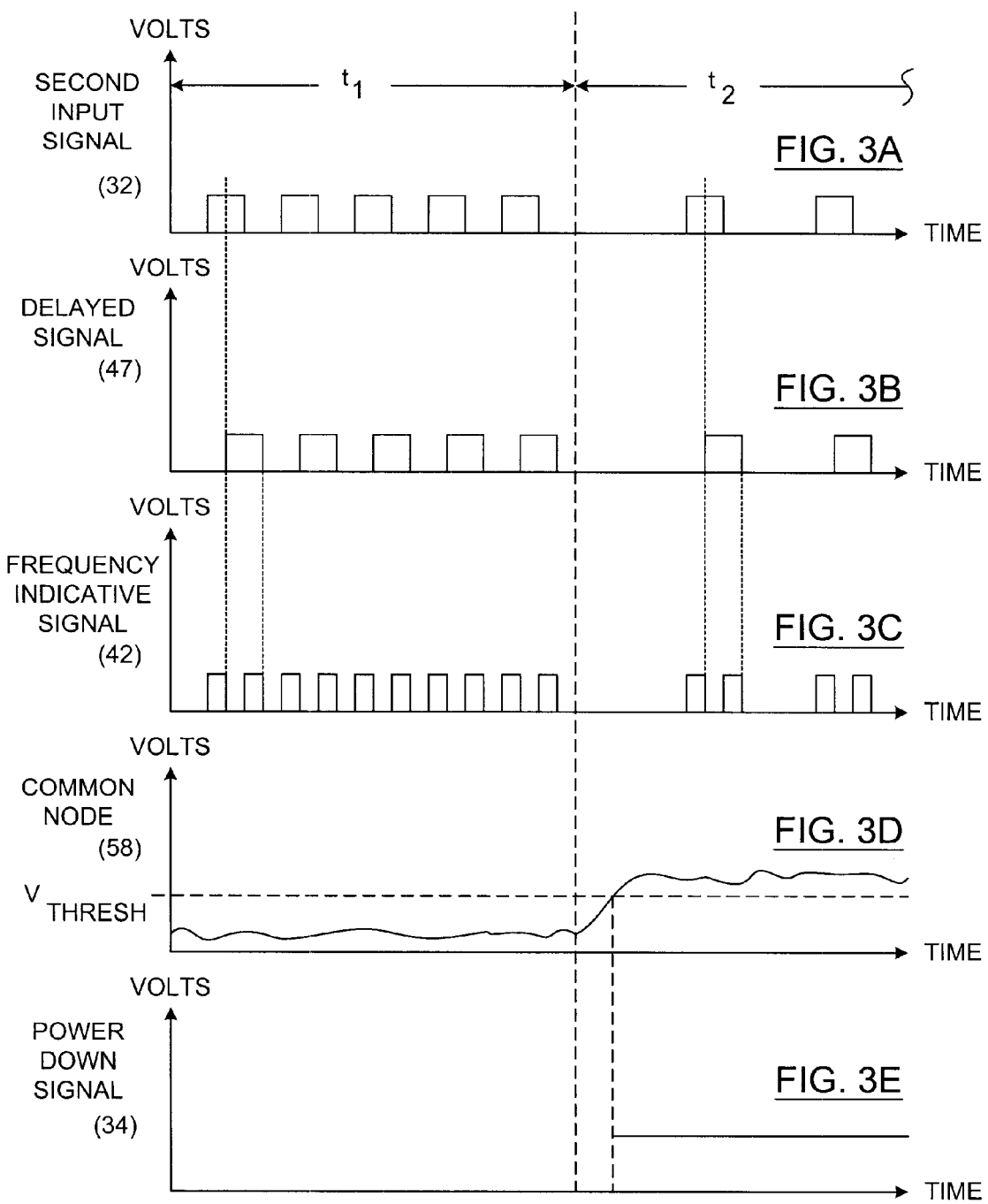
FIGS. 3A–3E are simplified, timing diagram views illustrating the relative transitions of various signals at various nodes during the operation of the frequency detector illustrated in FIG. 2.

One-shot circuit 40 may include a delay circuit 46 and an exclusive-or (XOR) gate 48. Delay circuit 46 may receive detector input signal 32 and output a delayed signal 47. Delay circuit 46 is conventional in the art and may take any one of the plurality of forms well-known in the art. XOR gate 48 may receive input signal 32, and the delayed signal 47, and output frequency indicator signal 42. Frequency indicator signal 42 is characterized by a signal transition edge for every edge (either rising or falling, and as best shown in FIG. 3C) of both detector input signal 32 and delayed signal 47. Therefore, as the frequency of signal 32 increases, so does the frequency of signal 42.

Power down signal output circuit 44 may include a resistor 50, a capacitor 52, a buffer 54, and a switch 56 (optional, but preferred). One end of resistor 50 may be connected to a voltage supply source. A second end of resistor 50 may be connected to a common node 58. One terminal of capacitor 52 may be connected to common node 58 while a second terminal of capacitor 52 may be connected to ground. Buffer 54 may have an input terminal connected to common node 58 and an output terminal for outputting power down signal 34. Finally, switch 56 may be connected at one terminal to common node 58 and at a second terminal to ground, and is responsive to frequency indicator signal 42 for selectively connecting common node 58 to ground. Buffer 54 switches the power down signal 34 from a first state (e.g., a logic low) to a second state (e.g. a logic high) when the voltage on its input terminal exceeds a predetermined threshold level. This threshold level is adjustable on a per-design basis to meet preselected design criteria. Switch 56 may take any one of the plurality of forms well-known to those of ordinary skill in the art. In one embodiment, for example, switch 56 comprises an n-channel field effect transistor (FET) Resistor 50 and capacitor 52 may comprise, respectively, any resistive device and any capacitive device, and may take any of the plurality of forms well-known in the art. For example, resistor 50 may comprise a conventional polysilicon load resistor or a conventional transistor with its power supply terminal electrically connected to its gate. Further, capacitor 52 may comprise a conventional conductor-insulator-conductor or conductor-insulator-semiconductor (e.g. MOS) capacitor, or may comprise a conventional transistor with its source and drain coupled to each other.

Although a particular circuit structure is disclosed for the frequency detector embodiment shown in FIG. 2, there are a plurality of structures well known and conventional in the art that are substantial equivalents for purposes of the present invention. For example, conventional passive RC filters can detect when an input signal has a frequency value below (or above) a threshold frequency.

In another embodiment, and with continued reference to FIG. 2, circuit 44 may be modified such that detector input signal 32 is applied to the terminal of resistor 50 opposite common node 58. In this embodiment, one-shot circuit 40 and switch 56 may be eliminated altogether. In such a configuration, resistor 50 and capacitor 52 form an RC filter whose output is provided to buffer 54, which outputs power down signal 34 when detector input signal 32 is below a preselected threshold frequency. This threshold frequency may be adjustable, having a value determined by the resistance value of resistor 50, the capacitance value of capacitor 52, and the input level threshold of buffer 54.

Referring now to FIGS. 3A–3E, the operation of frequency detector 26 will now be set forth. FIG. 3A illustrates the timing of detector input signal 32. In the preferred embodiment, input signal 32 is derived directly from device input signal 28. Therefore, FIG. 3A also serves to illustrate the timing of device input signal 28. During time period $t_1$, detector input signal 32 has a relatively high frequency. In a preferred zero-delay buffer embodiment, this relatively high frequency value (i.e., above the minimum frequency) indicates that operation of buffer 10 is proceeding normally. During time period $t_2$ however, detector input signal 32 transitions to a relatively low frequency, below the minimum frequency, thus indicating that a reduced power mode of operation should begin.

FIG. 3B illustrates the timing of delayed signal 47 that results from the passage of detector input signal 32 through delay circuit 46. Delayed signal 47 retains the same frequency and pulse width as signal 32, but is phase-shifted relative to signal 32, as indicated by the dashed lines between FIG. 3A and FIG. 3B.

FIG. 3C illustrates the time variation of frequency indicator signal 42, which is output from XOR gate 48. Frequency indicator signal 42 attains a high logic state on the rising edge of detector input signal 32. It then falls to a low logic state on the rising edge of delay signal 47. Frequency indicator signal 42 once again attains a high logic state on the falling edge of detector input signal 32 and subsequently falls to a low logic state on the falling edge of delayed signal 47. As shown in FIG. 3C, frequency indicator signal 42 attains a high logic state more often during periods of relatively high frequency, such as during time period $t_1$, than in periods of relatively low frequency, such as during time period $t_2$. When signal 42 is in a logic high state, switch 56 is ON, thereby discharging capacitor 52. Therefore, in general, switch 56 is in a conductive state in proportion to the frequency of signal 32.

FIG. 3D illustrates a voltage level at common node 58 as a function of time. The voltage level at common node 58 is a measurement of the voltage level across capacitor 52, when the other terminal of capacitor 52 is grounded, which is preferred. During time period $t_1$, switch 56 is closed (i.e., ON) more often than during time period $t_2$ because frequency indicator signal 42 is in a high logic state a relatively greater amount of the time. When switch 56 is closed (i.e. ON), a conductive channel is formed thereacross which effectively "shorts" the terminal of capacitor 52 to ground, thus inhibiting capacitor 52 from attaining a high voltage level. Consequently, the voltage level at common node 58, as illustrated in FIG. 3D, remains low. This configuration maintains a voltage level at common node 58 which is insufficient for buffer 54 to change its output state to a logic high.

During time period $t_2$, however, switch 56 is closed less often than during time period $t_1$ because frequency indicator signal 42 attains a high logic state less often. When switch 56 is opened, capacitor 52 is subject to a charging current from the power supply through resistor 50. This configuration enables charge to accumulate on capacitor 52, thereby raising the voltage at common node 58. Eventually, the voltage level at common node 58 passes a threshold voltage level (i.e., the level associated with buffer 54 indicated in FIG. 3D as $V_{THRESH}$). As illustrated in FIG. 3D, the voltage level at common node 58 will decrease when frequency indicator signal 42 has a high logic state (preferably by an amount proportional to the time during interval $t_2$ that signal 42 is in a high logic state), but the voltage level at common node 58 will not drop below the threshold voltage level unless detector input signal 32 once again attains a frequency value higher than the predetermined minimum frequency. It may take a few cycles (e.g. from 1 to 10, preferably from 2 to 6) of high-frequency input for the voltage at common node 58 to decrease below $V_{THRESH}$.

FIG. 3E illustrates the state of "power down" signal 34, generated at the output terminal of buffer 54, as a function of time. Power down signal 34 remains in a low logic state until the voltage level at common node 58 reaches the threshold voltage level $V_{THRESH}$ of buffer 54. During time period $t_1$, when detector input signal 32 has a relatively high frequency, power down signal 34 will remain in a logic low state because the voltage level at common node 58 remains below threshold voltage level $V_{THRESH}$. During time period $t_2$, however, when signal 32 has a relatively low frequency, power down signal 34 will attain a high logic state as soon as the voltage level on capacitor 52, and thus on common node 58, reaches the threshold voltage level $V_{THRESH}$.

The present invention may be able to save, in one constructed zero-delay buffer embodiment 10, about 15–20 mA of current at a minimum operating frequency level (e.g., 10 MHz), and about 120 mA at a maximum operation frequency level (e.g., 100 MHz), in a circuit and/or chip configured to operate at normal supply voltages. Current consumption in such an embodiment may be as low as 50 µA, or lower in the power down mode.

The illustrated frequency detector 26 may be used directly as illustrated for signal 32 when signals 32" and 32'" are employed, since these signals are periodic in nature. However, when signal 32' is used, which may be defined in terms of its variable magnitude (rather than frequency per se), an alternate circuit, such as a conventional comparator, may be used to determine when the corresponding minimum frequency threshold has been passed.

Figure 4:
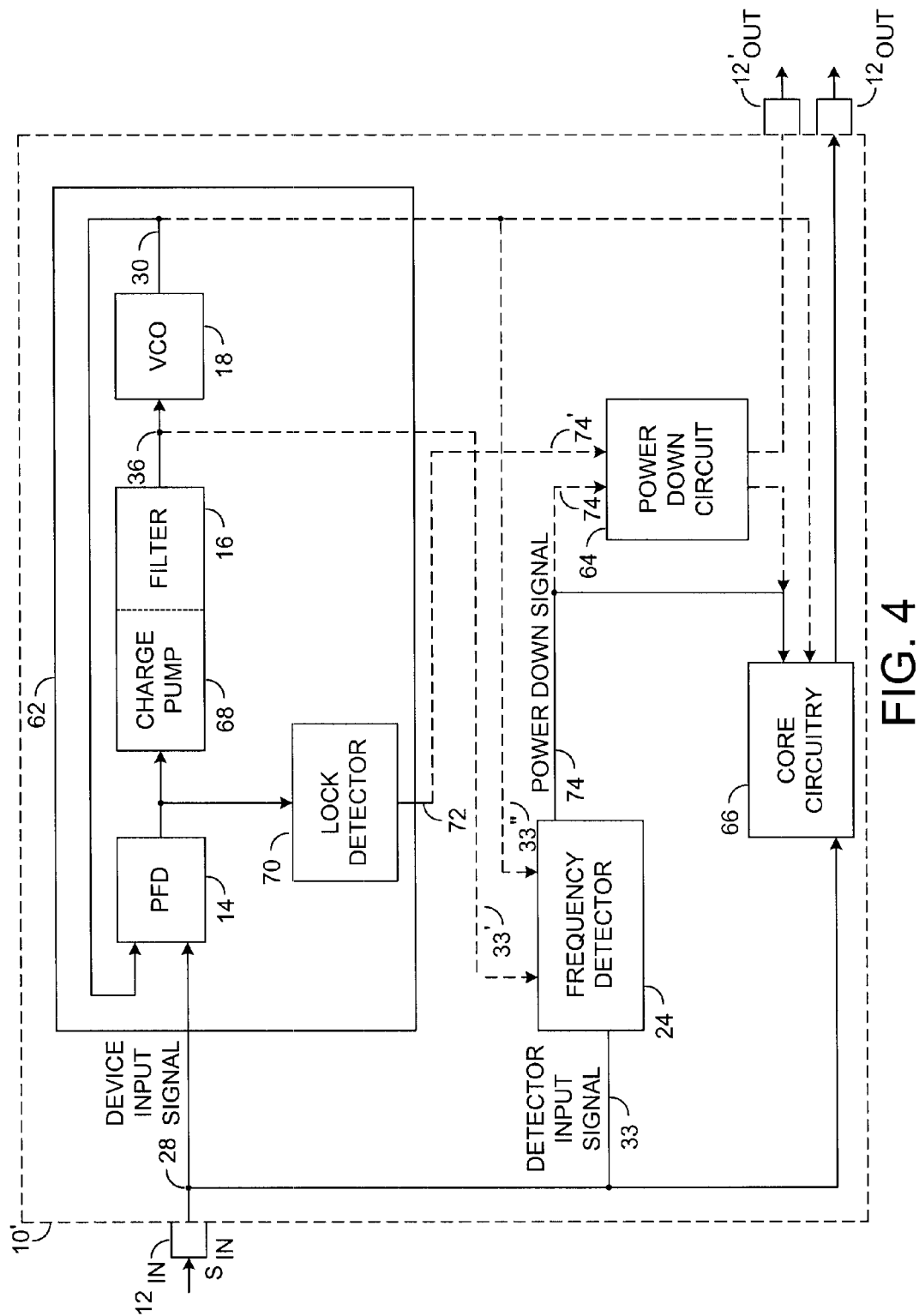
FIG. 4 is a block and schematic diagram view of an alternate, PLL-based embodiment according to the present invention.

FIG. 4 shows a second, Phase-Locked-Loop (PLL)-based embodiment of the present invention. This PLL-based embodiment may comprise a clock generator 10'. Generator 10' may process a periodic input signal $S_{IN}$ and generate one or more output signals $S_{OUT}$. Generator 10' may include means, such as a terminal or pin $12_{IN}$, for receiving device input signal 28, which performs a first function during normal operation of generator 10', and means, such as frequency detector 26, for determining when a detector input signal 33, which may correspond to or be derived from device input signal 28, is invalid according to a predetermined parameter. Detector 26 may also perform the function of generating, in response to the determination, a function control signal 74 configured to direct generator 10' and/or core circuitry 66 to perform a second function that is different from the first function.

In the clock generator embodiment 10', the predetermined parameter may comprise a minimum frequency associated with signal 33, the function control signal 74 may comprise a power down signal, and the second function may comprise reducing current and/or power (e.g. "powering down") to one or more component circuits of generator 10' and/or external devices (e.g. through output pad 12'$_{OUT}$). Alternate structures for performing the invalidity detection function are described above, at the beginning of the Description section. Clock generator 10' may further include a Phase Locked Loop (PLL) circuit 62, a power down circuit 64, and/or core circuitry 66.

Terminals 12$_{OUT}$ and 12'$_{OUT}$ are provided for interfacing generator 10' with external circuitry and devices. In the illustrated embodiment, generator 10' receives input signal S$_{IN}$ as device input signal 28 through terminal 12$_{IN}$. Device input signal 28 may be provided to both PLL 62 and core circuitry 66. Device input signal 28 may also be coupled directly to frequency detector 26 as detector input signal 33 (as is the case in the illustrated embodiment). In an alternate embodiment, however, device input signal 28 may be coupled indirectly to frequency detector 26 by passing device input signal 28 through a buffer prior to reaching detector 26.

PLL 62 may generate an output signal 30 that is substantially synchronized with device input signal 28. PLL 62 may comprise a conventional PLL, and further include a PFD 14, a charge pump 68, a filter 16, a VCO 18 and/or a PLL lock detector 70.

PFD 14 is conventional in the art and may be responsive to device input signal 28 and output signal 30. PFD 14 may generate at least one signal indicative of whether, and to what extent, output signal 30 is phase-locked (or out-of-lock) relative to device input signal 28. For example, this signal may comprise the well-known UP or DOWN signal, HIGH or LOW signal, or other signal representing a digital logic state (e.g., "0" [or below a threshold voltage] or "1" [or above a threshold voltage]).

Charge pump 68 is also conventional and may take any one of a plurality of forms well-known in the art. Charge pump 68 may be responsive to the signals generated by PFD 14 and is configured to generate a control signal the voltage of which corresponds to a phase error between output signal 30 and device input signal 28, as indicated by the signal(s) generated by PFD 14 (e.g., UP and DOWN).

Filter 16 may be coupled to charge pump 68 and may amplify and/or shape the transfer characteristic of the control signal generated by charge pump 68. Filter 16 generally may take the form of a low-pass filter and may output a modified control signal having a voltage potential corresponding to a phase error between output signal 30 and input signal 28.

VCO 18 is conventional and may take any one of a plurality of forms well known in the art. VCO 18 may receive the modified control signal from filter 16, and may generate in response thereto output signal 30. Signal 30 may have associated therewith a frequency that corresponds to the magnitude of the modified control signal. Output signal 30 is substantially synchronized with respect to input signal 28 when PLL 62 is "locked"—that is, when output signal 30 occupies or is within a predetermined phase error window with regard to device input signal 28.

Finally, lock detector 70 may generate a logical lock signal 72 indicative of whether output signal 30 and input signal 28 are phase-locked relative to each other (e.g., within a predetermined phase error margin for a predetermined time). Lock detector 70 may comprise any one of a plurality of conventional lock detectors known in the art.

Power down circuit 64 (shown enclosed by a dashed-line box) may optionally be included in generator 10' to translate power down signal 74 into correlative power down signals, configured for reception by the particular hardware design of core circuitry 66.

Core circuitry 66 may perform other operations or functions commonly found in generator 10', and is simply illustrated as an example of a component circuit thereof. Core circuitry 66 may take any one of a plurality of forms well known in the art. In the illustrated embodiment, core circuitry 66 may receive input signal S$_{IN}$ as well as generate output signal S$_{OUT}$.

In operation, frequency detector 26 operates as described above in connection with zero delay buffer embodiment 10. Detector 26 receives detector input signal 33 as an input, which is derived directly from device input signal 28.

In an alternative embodiment, the detector input signal may comprise signal 33' which may be derived from device input signal 28 indirectly by passing signal 28 through PFD 14 and/or filter 16. The potential of detector input signal 33' may be the voltage associated with control node 36 of PLL 62.

In yet another alternative embodiment, the detector input signal may comprise signal 33" which may be derived indirectly from device input signal 28 by passing signal 28 through PFD 14, filter 16 and/or VCO 18. Thus, the detector input signal may be the VCO output signal 30 itself. Alternatively, signal 33, signal 33', and signal 33" may each be passed through one or more buffers before reaching frequency detector 26. The detector input signal may therefore comprise a buffered version of the device input signal.

Frequency detector 26, determines whether detector input signal 33 has a frequency that is less than the minimum frequency and generates the power down signal 74 when detector input signal 33 does have a frequency less than the minimum frequency. The power down signal 74 then directs generator 10' to power down one or more of its component circuits, such as core circuitry 66, directly or indirectly through the use of power down circuit 64.

As described above, one aspect of the present invention relates to determining whether or not a preexisting input signal is valid according to a predetermined parameter, then entering a reduced power mode of operation (e.g., reducing current and/or power in a circuit) if the input signal is invalid. This provides a technique for implementing a power down or shutdown function where dedicated pins for such functions are unavailable. Therefore, the present invention, in general terms, depends on a signal invalidity detector responsive to the input signal. The input signal also performs or controls a function other than reducing power (e.g. to providing timing, to enable a function such as writing to or reading from a memory, or to input or output a signal to or from a circuit or the device,. etc.). Those skilled in the art will appreciate that other embodiments may be constructed to detect when such input signal is invalid. For example, other predetermined parameters which may be associated with PLLs, such as loss of phase lock, excessive jitter, or the voltage threshold on a control node, may be used to define the manner in which an "invalid" signal is defined. For example, PLL lock detector 70 may act as a signal invalidity detector by using the signals output by PFD 14 to determine when first input signal 28 is phase-locked with VCO output signal 30. If not, the input signal 28 may be considered "invalid" for purposes of entering a shutdown or power down mode.

The illustrated structure for frequency detector 26 may be used in an alternative embodiment where signal 33" is used (since it is periodic in nature). However, when signal 33' is used, a substitute structure, for example, a comparator, may be used to compare a threshold and/or minimum voltage level with the control voltage.

In addition, other structures for detecting low frequencies, including a state machine and/or latching logic, are within the spirit and scope of the present invention.

While the invention has been particularly shown and described with reference to the preferred embodiments thereof, it is well understood by those skilled in the art that various changes and modifications can be made in the invention without departing from the spirit and scope of the invention.

What is claimed is:

1. A semiconductor device comprising:
   an input terminal for accepting an input signal wherein said semiconductor device is configured to perform a predefined function when said input signal is valid according to a predetermined parameter;
   a signal invalidity detector having an input terminal for receiving said input signal, and an output terminal for outputting a function control signal configured to direct said semiconductor device to reduce power or current consumption in said semiconductor device when said signal invalidity detector indicates that said input signal is invalid according to said predetermined parameter; and
   a phase-locked loop (PLL) circuit having an input terminal configured to receive said input signal, and an output terminal configured to generate a PLL output signal, wherein said input signal comprises said PLL output signal.

2. A semiconductor device as described in claim 1 selected from the group consisting of a zero delay buffer and a clock generator.

3. A semiconductor device comprising:
   an input terminal configured to receive an input signal, wherein said semiconductor device is configured to perform a predefined function in response to said input signal during normal operation; and
   a signal invalidity detector having (i) an input configured to receive said input signal, and (ii) an output configured to present a function control signal configured to control a power down function when said signal invalidity detector indicates that said input signal is invalid according to a minimum frequency.

4. The device according to claim 3, wherein said input signal has a frequency, and said signal invalidity detector comprises:
   a filter circuit configured to receive a frequency indicator signal indicative of said frequency of said input signal and present said function control signal.

5. The device according to claim 4, wherein said filter circuit comprises:
   a resistor connected to a first voltage source and to a common node; and
   a capacitor connected to said common node and to a second voltage source.

6. The device according to claim 5, wherein said filter circuit further comprises:
   a switch responsive to said frequency indicator signal for selectively discharging said capacitor.

7. The device according to claim 6, wherein said switch comprises an n-channel field effect transistor.

8. The device according to claim 5, wherein said filter circuit further comprises:
   a buffer having an input terminal connected to said common node and an output terminal configured to generate said function control signal when said frequency indicator signal indicates that said frequency of said input signal is less than said minimum threshold frequency.

9. The device according to claim 4, wherein said signal invalidity detector further comprises:
   a delay circuit configured to generate a delayed signal in response to said input signal; and
   an exclusive-or (XOR) gate configured to generate said frequency indicator signal in response to said input signal and said delayed signal.

10. The device according to claim 3, wherein said input signal comprises a buffered input signal.

11. The device according to claim 3, wherein said input signal comprises an input clock signal.

12. The device according to claim 3, wherein said device further comprises a phase-locked loop (PLL) circuit configured to generate a PLL output signal having an input configured to receive said input signal and an output configured to present said PLL output signal.

13. The device according to claim 3, wherein said power down function comprises (i) decreasing a power consumption of said device or (ii) a current reduction.

14. A semiconductor device as described in claim 3 selected from the group consisting of a zero delay buffer and a clock generator.

15. A semiconductor device comprising:
    means for receiving an input signal, wherein said semiconductor device is configured to perform a predefined function in response to said input signal during normal operation; and
    means for determining when said input signal is valid or invalid according to a minimum frequency and generating in response thereto a function control signal configured to control a power down function.

16. A semiconductor device as described in claim 15 selected from the group consisting of a zero delay buffer and a clock generator.

17. A method for controlling a power down function on a semiconductor device comprising the steps of:
    (A) with a signal invalidity detector on said semiconductor device, determining when a device input signal is valid or invalid according to a minimum frequency, wherein said device is configured to perform a first predefined function in response to said device input signal during normal operation; and
    (B) when said device input signal is invalid, generating a function control signal on said semiconductor device configured to control said power down function.

18. The method according to claim 17, wherein said input signal comprises an input clock signal.

19. The method according to claim 17, wherein said semiconductor device further comprises a phase-locked loop (PLL) circuit configured to generate a PLL output signal in response to said input signal.

20. The method according to claim 17, wherein said semiconductor device is selected from the group consisting of a zero delay buffer and a clock generator.

* * * * *